United States Patent
Price et al.

(10) Patent No.: US 11,754,625 B2
(45) Date of Patent: Sep. 12, 2023

(54) SYSTEM AND METHOD FOR IDENTIFYING LATENT RELIABILITY DEFECTS IN SEMICONDUCTOR DEVICES

(71) Applicant: KLA Corporation, Milpitas, CA (US)

(72) Inventors: David W. Price, Austin, TX (US); Robert J. Rathert, Mechanicsville, VA (US); Chet V. Lenox, Lexington, TX (US); Robert Cappel, Pleasanton, CA (US); Oreste Donzella, San Ramon, CA (US); Kara L. Sherman, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 125 days.

(21) Appl. No.: 17/151,583

(22) Filed: Jan. 18, 2021

(65) Prior Publication Data

US 2021/0239757 A1    Aug. 5, 2021

Related U.S. Application Data

(60) Provisional application No. 62/967,964, filed on Jan. 30, 2020.

(51) Int. Cl.
*G01R 31/3185* (2006.01)
*G01R 31/28* (2006.01)

(52) U.S. Cl.
CPC .. *G01R 31/318511* (2013.01); *G01R 31/2817* (2013.01)

(58) Field of Classification Search
None
See application file for complete search history.

(56) References Cited

U.S. PATENT DOCUMENTS

| 6,154,714 A * | 11/2000 | Lepejian ........ G01R 31/318307 700/121 |
| 6,751,519 B1 | 6/2004 | Satya et al. |
| 6,813,572 B2 | 11/2004 | Satya et al. |

(Continued)

OTHER PUBLICATIONS

Breaux, Louis et al., "Pareto charts for defect analysis with correlation of inline defects to failed bitmap data," Proc. SPIE 10274, Handbook of Critical Dimension Metrology and Process Control: A Critical Review, 1027401 (Jul. 1, 1994): https://doi.org/10.1117/12.187459.

(Continued)

*Primary Examiner* — Jermele M Hollington
(74) *Attorney, Agent, or Firm* — Suiter Swantz pc llo

(57) ABSTRACT

A system and method for identifying latent reliability defects (LRD) in semiconductor devices are configured to perform one or more stress tests with one or more stress test tools on at least some of a plurality of wafers received from one or more in-line sample analysis tools to determine a passing set of the plurality of wafers and a failing set of the plurality of wafers, perform a reliability hit-back analysis on at least some of the failing set of the plurality of wafers, analyze the reliability hit-back analysis to determine one or more geographic locations of one or more die fail chains caused by one or more latent reliability defects (LRD), and perform a geographic hit-back analysis on the one or more geographic locations of the one or more die fail chains caused by the LRD.

27 Claims, 11 Drawing Sheets

(56) References Cited

U.S. PATENT DOCUMENTS

| | | | |
|---|---|---|---|
| 8,009,895 B2* | 8/2011 | Lee | G06T 7/0004 |
| | | | 324/750.01 |
| 10,761,128 B2* | 9/2020 | Price | G01R 31/2601 |
| 10,867,877 B2* | 12/2020 | Rathert | H01L 22/34 |
| 11,293,970 B2* | 4/2022 | Price | G01R 31/2837 |
| 11,614,480 B2* | 3/2023 | Price | H01L 22/12 |
| | | | 324/762.05 |
| 2006/0076490 A1 | 4/2006 | Gunji et al. | |
| 2008/0187842 A1 | 8/2008 | Hung et al. | |
| 2016/0314578 A1 | 10/2016 | Banerjee et al. | |
| 2017/0074923 A1 | 3/2017 | Su et al. | |
| 2018/0275189 A1 | 9/2018 | Price et al. | |
| 2022/0196723 A1* | 6/2022 | Price | G01R 31/2894 |
| 2022/0260632 A1* | 8/2022 | Rathert | G01R 31/2894 |

OTHER PUBLICATIONS

Lenox, Chet et al., "Hitback Analysis Improves Defect Visibility", YMS Magazine, Printed Jan. 30, 2020, https://www.ymsmagazine.com/wp-content/uploads/YMS_Mag_PW_14_ENG.pdf.

U.S. Appl. No. 17/101,856, filed Nov. 23, 2020, entitled Advanced in-Line Part Average Testing.

PCT International Search Report and Written Opinion for International Application No. PCT/US2020/015350 dated May 14, 2021, 7 pages.

\* cited by examiner

SYSTEM AND METHOD FOR IDENTIFYING LATENT RELIABILITY DEFECTS IN SEMICONDUCTOR DEVICES

CROSS-REFERENCE TO RELATED APPLICATION

The present application claims the benefit under 35 U.S.C. § 119(e) of U.S. Provisional Application Ser. No. 62/967,964 filed on Jan. 30, 2020, which is incorporated herein by reference in the entirety.

TECHNICAL FIELD

The present disclosure relates generally to semiconductor devices and, more particularly, to systems and methods for identifying latent reliability defects in semiconductor devices.

BACKGROUND

Fabrication of semiconductor devices may typically require hundreds or thousands of processing steps to form a functioning device. Over the course of these processing steps, various inspection and/or metrology measurements may be performed to identify defects and/or monitor various parameters on the devices. Electrical testing may also be performed to verify or assess the functionality of the device. However, while some detected defects and metrology errors may be so significant as to clearly indicate a device failure, lesser variations may cause early reliability failures of the device after exposure to their working environment. Risk-averse users of semiconductor devices, such as automotive, military, aeronautical and medical applications, are beginning to look for failure rates in the parts-per-billion (PPB) range, exceeding current parts-per-million (PPM) levels. Recognizing and controlling reliability defects is key to meeting these industry requirements, as the need for semiconductor devices in automotive, military, aeronautical, and medical applications continues to increase. Therefore, it may be desirable to provide systems and methods for reliability defect detection.

SUMMARY

A system is disclosed, in accordance with one or more embodiments of the present disclosure. In one illustrative embodiment, the system includes a controller communicatively coupled to one or more in-line sample analysis tools and one or more stress test tools. In another illustrative embodiment, the controller includes one or more processors configured to execute program instructions causing the one or more processors to perform one or more stress tests with the one or more stress test tools on at least some of a plurality of wafers to determine a passing set of the plurality of wafers and a failing set of the plurality of wafers. In another illustrative embodiment, the plurality of wafers is received from the one or more in-line sample analysis tools. In another illustrative embodiment, each wafer of the plurality of wafers includes a plurality of layers. In another illustrative embodiment, each layer of the plurality of layers includes a plurality of dies. In another illustrative embodiment, the controller includes one or more processors configured to execute program instructions causing the one or more processors to perform a reliability hit-back analysis on at least some of the failing set of the plurality of wafers. In another illustrative embodiment, the controller includes one or more processors configured to execute program instructions causing the one or more processors to analyze the reliability hit-back analysis to determine one or more geographic locations of one or more die fail chains caused by one or more latent reliability defects (LRD). In another illustrative embodiment, the controller includes one or more processors configured to execute program instructions causing the one or more processors to perform a geographic hit-back analysis on the one or more geographic locations of the one or more die fail chains caused by the LRD.

A method is disclosed, in accordance with one or more embodiments of the present disclosure. In one illustrative embodiment, the method may include, but is not limited to, performing one or more stress tests with one or more stress test tools on at least some of a plurality of wafers to determine a passing set of the plurality of wafers and a failing set of the plurality of wafers. In another illustrative embodiment, the plurality of wafers is received from one or more in-line sample analysis tools. In another illustrative embodiment, each wafer of the plurality of wafers includes a plurality of layers. In another illustrative embodiment, each layer of the plurality of layers includes a plurality of dies. In another illustrative embodiment, the method may include, but is not limited to, performing a reliability hit-back analysis on at least some of the failing set of the plurality of wafers. In another illustrative embodiment, the method may include, but is not limited to, analyzing the reliability hit-back analysis to determine one or more geographic locations of one or more die fail chains caused by one or more latent reliability defects (LRD). In another illustrative embodiment, the method may include, but is not limited to, performing a geographic hit-back analysis on the one or more geographic locations of the one or more die fail chains caused by the LRD.

A system is disclosed, in accordance with one or more embodiments of the present disclosure. In one illustrative embodiment, the system includes one or more in-line sample analysis tools. In another illustrative embodiment, the system includes one or more stress test tools. In another illustrative embodiment, the system includes a controller communicatively coupled to the one or more in-line sample analysis tools and the one or more stress test tools. In another illustrative embodiment, the controller includes one or more processors configured to execute program instructions causing the one or more processors to perform one or more stress tests with the one or more stress test tools on at least some of a plurality of wafers to determine a passing set of the plurality of wafers and a failing set of the plurality of wafers. In another illustrative embodiment, the plurality of wafers is received from the one or more in-line sample analysis tools. In another illustrative embodiment, each wafer of the plurality of wafers includes a plurality of layers. In another illustrative embodiment, each layer of the plurality of layers includes a plurality of dies. In another illustrative embodiment, the controller includes one or more processors configured to execute program instructions causing the one or more processors to perform a reliability hit-back analysis on at least some of the failing set of the plurality of wafers. In another illustrative embodiment, the controller includes one or more processors configured to execute program instructions causing the one or more processors to analyze the reliability hit-back analysis to determine one or more geographic locations of one or more die fail chains caused by one or more latent reliability defects (LRD). In another illustrative embodiment, the controller includes one or more processors configured to execute program instructions causing the one or more processors to perform a geographic hit-back analysis on the one or more geographic locations of the one or more die fail chains caused by the LRD.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Figure 1A:
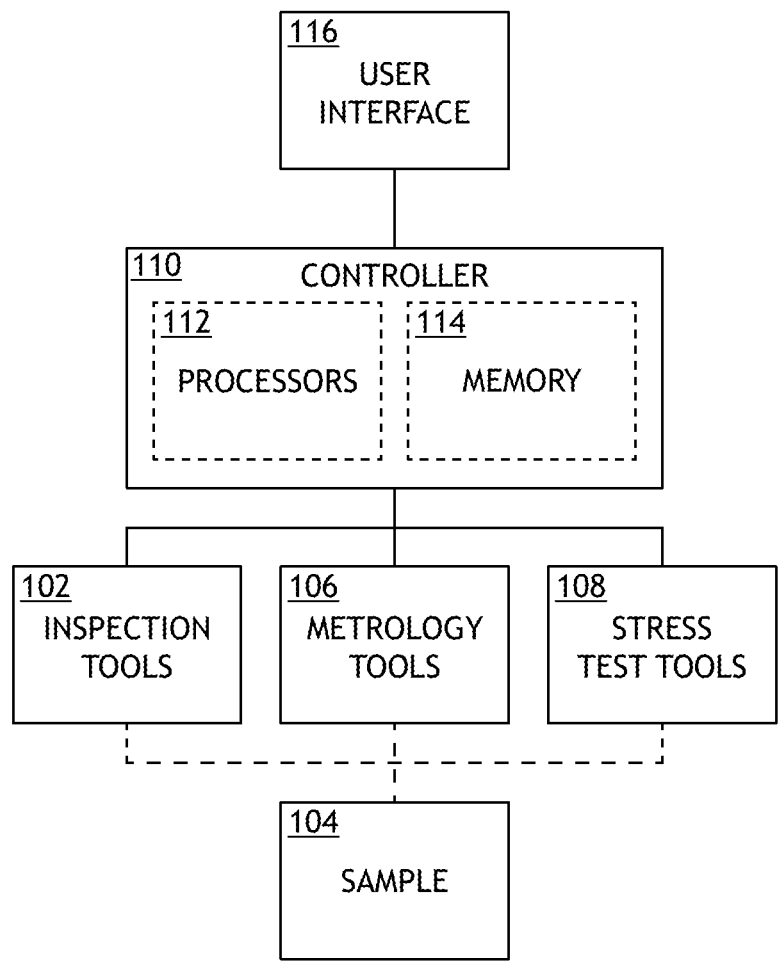
FIG. 1A is a block diagram view of a system for identifying latent reliability defects (LRD), in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for identifying latent reliability defects (LRD) in semiconductor devices. In particular, embodiments of the present disclosure are directed to identifying sources of LRD in baseline manufacturing processes in devices including, but not limited to, semiconductor devices. Some embodiments of the present disclosure are directed to detecting LRD that may not result in failure during manufacturing/testing or may not lead to immediate device failure during operation, but may lead to early-life failure of the device during operation when used in a working environment.

Defects arising during the manufacturing process may have a wide range of impacts on the performance of the device in the field. For example, "killer" defects may result in immediate device failure, whereas many minor defects may have little or no impact on the performance of the device throughout the device lifetime. However, there may be a class of defects, referred to herein as latent reliability defects (LRD) (or reliability defects or latent defects, for purposes of the present disclosure), that may not lead to failure during manufacturing/testing or may not lead to immediate device failure during operation, but may lead to early-life failure of the device during operation when used in a working environment. The LRD may be generated by a defect mechanism within a manufacturing line that is operating in a nominal condition without excursion. The LRD are not yield-limiting, and thus cannot or will not be identified through traditional e-test and baseline pareto methods.

It is noted herein "LRD" may represent a single latent reliability defect or multiple latent reliability defects, for purposes of the present disclosure. In addition, it is noted herein the terms "manufacturing process" and "fabrication process" may be considered equivalent, along with respective variants of the terms (e.g., "manufacturing line," "fabrication line," and the like), for purposes of the present disclosure.

Various strategies may be utilized to monitor or control the reliability of devices based on a semiconductor device's fabrication LRD baseline pareto. The various strategies allow for fabrication processes to achieve part-per-million (PPM) levels of baseline reliability defect control, dependent on chip complexity and size. A new requirement for select semiconductor fabrication industries (e.g., automotive, military, aeronautical, and medical industries) is part-per-billion (PPB) control levels, requiring improved systems and methods to identify sources of reliability failures.

One type of strategy may include end-of-line (EOL) reliability testing being completed in conjunction with burn-in or other stress tests. Semiconductor device makers currently utilize EOL electrical reliability testing in conjunction with burn-in and other stress tests to create an electrical reliability, or ("'rel'") pareto. This methodology is primarily limited by the type of information which can be gleaned from e-test. Thus, identified failure mechanisms typically can only reference the electrical characteristics of the failure (e.g., "type 1 failure" or "single bit failure"). While this may provide clues to the source, it frequently does not give the semiconductor fabrication process enough actionable information about root cause to effectively direct engineering improvement studies. In practice, EOL reliability testing completed in conjunction with burn-in or other stress tests is mostly used to identify sources of intrinsic defectivity (e.g., versus extrinsic mechanisms such as defectivity), and to quantify the rate of reliability (e.g., versus determining or enabling a root cause identification of failures).

For example, electrical testing of dies is performed to evaluate the functioning of one or more aspects of the die as data for reliability analysis. In addition, the burn-in or other stress tests may be performed at any point in the manufacturing process and may include, but is not limited to, a pre burn-in electrical wafer sort and final test (e.g., an e-test) or a post burn-in electrical test. Semiconductor devices that fail an electrical testing step may be isolated from other, passing semiconductor devices. For example, dies or wafers may be removed from the supply chain (e.g., discarded) or flagged for further testing.

However, electrical testing alone may not provide sufficient information to meet stringent reliability standards while maintaining cost and throughput targets. For example, a post burn-in electrical test may provide an accurate analysis of the functioning of a die since the die is in a near-final state, but may not be practical in high volumes due to cost, time requirements, or the potential for introducing long-term reliability problems. By way of another example, electrical testing during any step of production provides pass/fail information suitable for identifying devices already exhibiting full or partial failures, but may not be suitable identifying devices that may fail at a later time (e.g., devices having latent defects). By way of another example, it is often impractical or sometimes impossible to fully characterize each die using electrical testing, resulting in gaps in the electrical testing. For instance, there may exist theoretically-possible defects in a particular circuit layout that may not be detectable using electrical testing even with a "perfect" testing strategy. It is noted herein it also may not be cost-effective or practical to fully characterize all aspects of each die such that a selected testing strategy may deviate from an otherwise "perfect" or otherwise optimized testing strategy). For example, imperfect test coverage may result from, but is not limited to, untestable areas of a particular circuit, analog circuits that may be difficult to test (e.g., high-voltage analog circuits), or circuits that would require complex simultaneous or sequential energizing of multiple portions. For the purposes of the present disclosure, the term "test coverage" is used to broadly describe metrics used to evaluate the performance of a testing strategy.

Another type of strategy may include standard in-line defect baseline pareto methodologies coupled with an inference the defect causing reliability problems are the same or similar to yield-limiting defects, or ("yield") pareto. Semiconductor device makers create in-line defect baseline pareto for yield-limiting defects. This information may be used in reliability studies by assuming that the sources of defect-driven (extrinsic) reliability failures are proportional to the yield-limiting failures. One disadvantage of this approach is that the latent reliability defect pareto will almost certainly differ from the yield-limiting pareto in both relative population and priority. This uncertainty may be partially diminished by using the reliability pareto (or rel pareto) to bias the yield pareto. However, it is noted some LRD are not correlated with yield-limiting defects. In addition, it is noted many LRD are only formed within a narrow range of size for the yield limiting defect, the size of which often being device or technology specific.

Another type of strategy may include a physical failure analysis (PFA) of field reliability returns. Automotive semiconductor device makers are usually required to perform PFA of field reliability returns. For example, the field reliability returns may be from the tier 1 component supplier, assembly at the automotive OEM, or warranty field returns from the end consumer. The field reliability returns may not provide enough information to create an actionable pareto of in-line reliability sources. For example, there may be a lack of statistical significance, as the PPM number of failures may be so small that it is difficult to arrive at a comprehensive understanding of the baseline reliability pareto from a handful of field returns. By way of another example, field returns may provide information which reflects on the reliability problems of the semiconductor fabrication processes at the time the failing device was manufactured, potentially resulting in a considerable delay between the manufacturing and the observing (e.g., including potentially on the order of years). In general, PFA may be expensive, time-consuming, and/or frequently inconclusive or incorrect.

It is noted herein one limitation of the various strategies presented may include the root cause of the failure being destroyed, either by the activation process of the LRD or by collateral damage from the PFA delaying process.

It is to be understood that the labels "latent defects," "reliability defects," "latent reliability defects," or LRD, and the like are used herein solely for illustrative purposes and should not be interpreted as limiting. Further, examples of defect-based reliability determination and control described herein related to specific types of defects (e.g., latent defects, reliability defects, LRD, or the like) are also provided solely for illustrative purposes and should not be interpreted as limiting. Rather, the various methodologies for defect-based reliability predictions may generally be used to identify any type of defect or multiple types of defects, regardless of the label used to describe the defect.

Referring now to FIGS. 1A-6, systems and methods for identifying LRD in semiconductor devices are described, in accordance with one or more embodiments of the present disclosure.

Figure 1B:
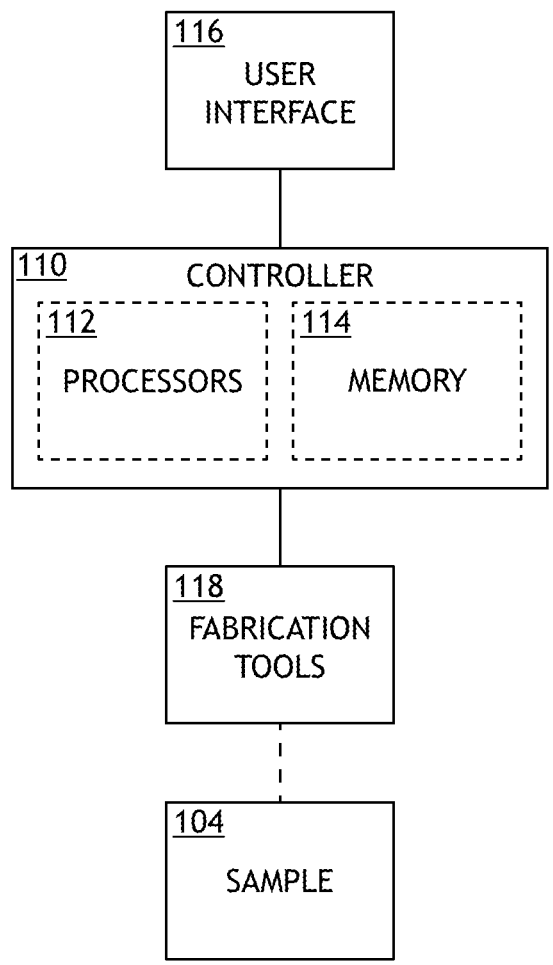
FIG. 1B is a block diagram view of a system for identifying LRD, in accordance with one or more embodiments of the present disclosure.

FIGS. 1A and 1B in general are block diagram views of a system 100 for identifying LRD in accordance with one or more embodiments of the present disclosure.

In one embodiment, the system 100 includes at least one inspection tool 102 (e.g., an in-line sample analysis tool) for detecting defects in one or more layers of a sample 104. The system 100 may generally include any number or type of inspection tool 102. For example, an inspection tool 102 may include an optical inspection tool configured to detect defects based on interrogation of the sample 104 with light from any source such as, but not limited to, a laser source, a lamp source, an X-ray source, or a broadband plasma source. By way of another example, an inspection tool 102 may include a particle-beam inspection tool configured to detect defects based on interrogation of the sample with one or more particle beams such as, but not limited to, an electron beam, an ion beam, or a neutral particle beam. For instance, the inspection tool 102 may include a transmission electron microscope (TEM) or a scanning electron microscope (SEM). For purposes of the present disclosure, it is noted herein the at least one inspection tool 102 may be a single inspection tool 102 or may represent a group of inspection tools 102.

In another embodiment, the sample 104 is a wafer of a plurality of wafers, each wafer of the plurality of wafers including a plurality of layers. In another embodiment, each of the plurality of layers includes a plurality of dies. In another embodiment, each of the plurality of dies includes a plurality of blocks. For the purposes of the present disclosure, a defect may be considered to be any deviation of a fabricated layer or pattern in a layer from design characteristics including, but not limited to, physical, mechanical, chemical, or optical properties. Further, a defect may have any size relative to a die or features thereon. In this way, a defect may be smaller than a die (e.g., on the scale of one or more patterned features) or may be larger than a die (e.g., as part of a wafer-scale scratch or pattern). For example, a defect may include deviation of a thickness or composition of a sample layer before or after patterning. By way of another example, a defect may include a deviation of a size, shape, orientation, or position of a patterned feature. By way of another example, a defect may include imperfections associated with lithography and/or etching steps such as, but not limited to, bridges between adjacent structures (or lack thereof), pits, or holes. By way of another example, a defect may include a damaged portion of a sample 104 such as, but not limited to, a scratch, or a chip. For instance, a severity of the defect (e.g., the length of a scratch, the depth of a pit, measured magnitude or polarity of the defect, or the like) may be of importance and taken into consideration. By way of another example, a defect may include a foreign particle introduced to the sample 104. Accordingly, it is to be understood that examples of defects in the present disclosure are provided solely for illustrative purposes and should not be interpreted as limiting.

In another embodiment, the system 100 includes at least one metrology tool 106 (e.g., an in-line sample analysis tool) for measuring one or more properties of the sample 104 or one or more layers thereof. For example, a metrology tool 106 may characterize properties such as, but not limited to, layer thickness, layer composition, critical dimension (CD), overlay, or lithographic processing parameters (e.g., intensity or dose of illumination during a lithographic step). In this regard, a metrology tool 106 may provide information about the fabrication of the sample 104, one or more layers of the sample 104, or one or more dies of the sample 104 that may be relevant to the probability of manufacturing defects that may lead to reliability issues for the resulting fabricated devices. For purposes of the present disclosure, it is noted herein the at least one metrology tool 106 may be a single metrology tool 106 or may represent a group of metrology tool 106.

In another embodiment, the system 100 includes at least one stress test tool 108 for testing the functionality of one or more portions of a manufactured device. The system 100 may include any number or type of stress test tool 108 to test, inspect, or otherwise characterize the properties of one or more portions of a fabricated device at any point in the manufacturing cycle. For example, the stress test tool 108 may include, but is not limited to, a pre burn-in electrical test tool or a post burn-in electrical test tool configured to heat the sample 104 (e.g., an oven or other heat source), configured to cool the sample 104 (e.g., a freezer or other cold source), configured to operate the sample 104 at an incorrect voltage (e.g., a power supply), or the like.

In one embodiment, the system 100 includes a controller 110. The controller 110 may include one or more processors 112 configured to execute program instructions maintained on memory 114 (e.g., a memory medium, memory device, or the like). Further, the controller 110 may be communicatively coupled with any of the components of the system 100 including, but not limited to, the inspection tool 102, the metrology tool 106, or the stress test tool 108.

In this regard, the one or more processors 112 of controller 110 may execute any of the various process steps described throughout the present disclosure. For example, the one or more processors 112 of controller 110 may be configured to perform one or more of characterizing one or more wafers of a plurality of wafers with high sensitivity defect inspection on one or more critical layers, performing electrical wafer sorting (EWS) on the plurality of wafers based on the characterization with high sensitivity defect inspection on the one or more critical layers of the one or more wafers, performing hit-back analysis on at least some of a set of wafers failing the EWS, performing one or more stress tests on at least some of a set of wafers passing the EWS, testing the at least some of the set of wafers passing the EWS and subjected to the one or more stress tests, performing reliability hit-back analysis on at least some of a set of wafers passing the EWS and failing the one or more stress tests, analyzing a combination of the hit-back analysis and the reliability hit-back analysis to determine geographic locations of failures caused by LRD, performing a geographic hit-back analysis on the geographic locations of failures caused by the LRD, generating one or more defect images including the LRD, and/or generating one or more statistical representations of the LRD.

The one or more processors 112 of a controller 110 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 112 may include any device configured to execute algorithms and/or instructions (e.g., program instructions stored in memory). In one embodiment, the one or more processors 112 may be embodied as a desktop computer, mainframe computer system, workstation, image computer, parallel processor, networked computer, or any other computer system configured to execute a program configured to operate or operate in conjunction with the system 100, as described throughout the present disclosure.

The memory 114 may include any storage medium known in the art suitable for storing program instructions executable by the associated one or more processors 112. For example, the memory 114 may include a non-transitory memory medium. By way of another example, the memory 114 may include, but is not limited to, a read-only memory (ROM), a random-access memory (RAM), a magnetic or optical memory device (e.g., disk), a magnetic tape, a solid-state drive and the like. It is further noted that the memory 114 may be housed in a common controller housing with the one or more processors 112. In one embodiment, the memory 114 may be located remotely with respect to the physical location of the one or more processors 112 and the controller 110. For instance, the one or more processors 112 of the controller 110 may access a remote memory (e.g., server), accessible through a network (e.g., internet, intranet and the like).

In one embodiment, a user interface 116 is communicatively coupled to the controller 110. In one embodiment, the user interface 116 may include, but is not limited to, one or more desktops, laptops, tablets, and the like. In another embodiment, the user interface 116 includes a display used to display data of the system 100 to a user. The display of the user interface 116 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 116 is suitable for implementation in the present disclosure. In another embodiment, a user may input selections and/or instructions responsive to data displayed to the user via a user input device of the user interface 116.

In one embodiment, the system 100 includes at least one semiconductor manufacturing tool or semiconductor fabrication tool 118. For example, the semiconductor fabrication tool 118 may include any tool known in the art including, but not limited to, an etcher, scanner, stepper, cleaner, or the like. A fabrication process may include fabricating multiple dies distributed across the surface of a sample 104 (e.g., a semiconductor wafer, or the like), where each die includes multiple patterned layers of material forming a device component. Each patterned layer may be formed by the semiconductor fabrication tool 118 via a series of steps including material deposition, lithography, etching to generate a pattern of interest, and/or one or more exposure steps (e.g., performed by a scanner, a stepper, or the like). For purposes of the present disclosure, it is noted herein the at least one semiconductor fabrication tool 118 may be a single semiconductor fabrication tool 118 or may represent a group of semiconductor fabrication tools 118.

In another embodiment, LRD are identified using any combination of in-line sample analysis tools (e.g., inspection tools 102 or metrology tools 106) after one or more processing steps (e.g., lithography, etching, or the like) for layers of interest in the dies. In this regard, the defect detection at various stages of the manufacturing process may be referred to as in-line defect detection.

It is noted herein the embodiments illustrated in FIG. 1A and the embodiments illustrated in FIG. 1B may be considered parts of the same system 100 or different systems 100, for purposes of the present disclosure. In addition, it is noted herein components within the system 100 illustrated in FIG. 1A and components within the system 100 illustrated in FIG. 1B may be in direct communication or may communicate through the controller 110.

Figure 2A:
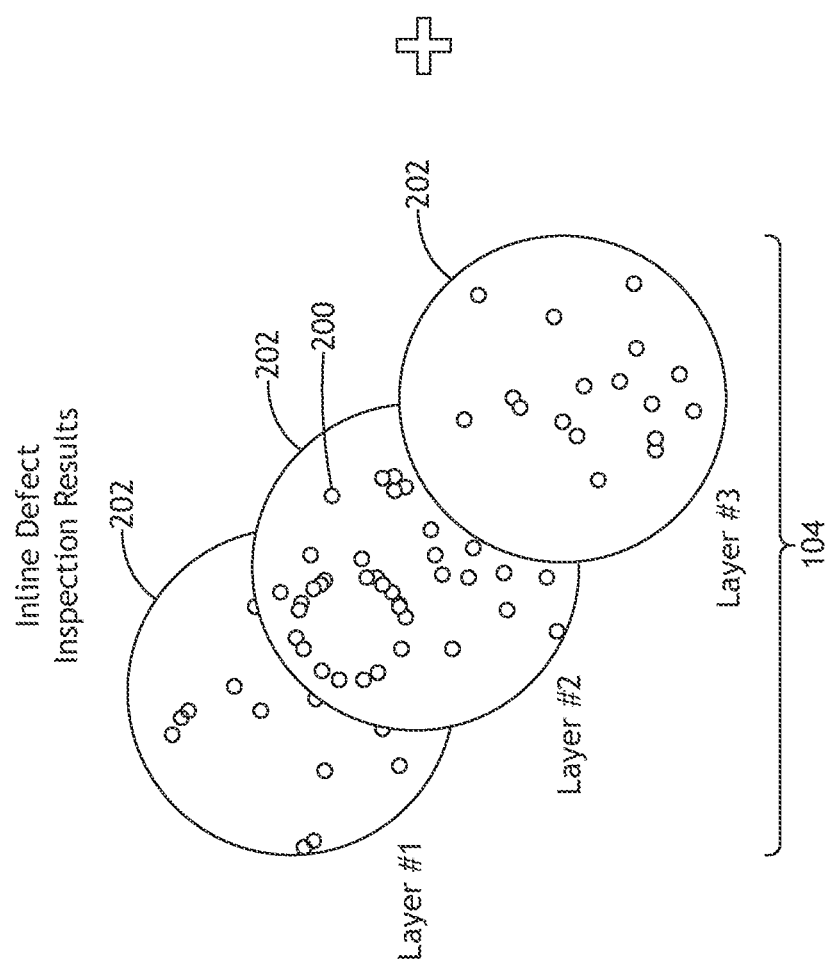
FIG. 2A is a conceptual illustration of in-line defect inspection results for multiple layers of a wafer, in accordance with one or more embodiments of the present disclosure.
Figure 2B:
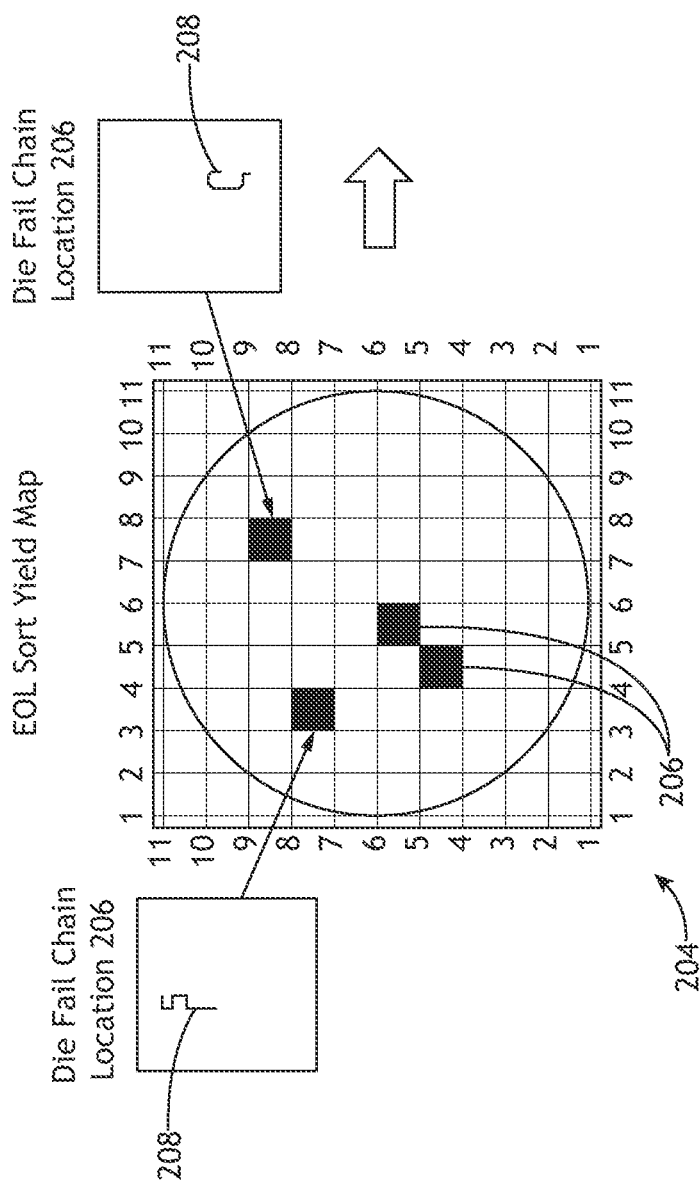
FIG. 2B is a conceptual illustration of an end-of-line (EOL) sort yield map for a wafer, in accordance with one or more embodiments of the present disclosure.
Figure 2C:
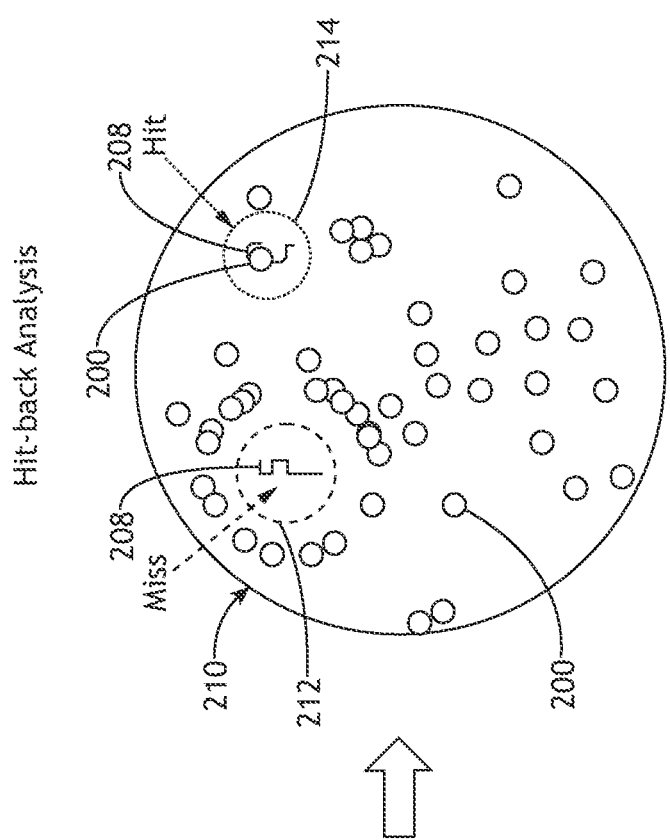
FIG. 2C is a conceptual illustration of a hit-back analysis for the aggregation of defects based on in-line defect inspection results in multiple layers of a wafer and an end-of-line (EOL) sort yield map, in accordance with one or more embodiments of the present disclosure.

FIGS. 2A-2C are conceptual illustrations of the aggregation of defects in multiple layers of a sample 104 in accordance with one or more embodiments of the present disclosure.

Select yield-based hit-back analysis methodologies and processes for defect-limited yield pareto include correlating EOL yield failures to in-line sources that cause the failure. EOL yield failures guide PFA, often in the form of a cross-section TEM confirmation of a physical defect. This physical location is then overlaid against in-line defect locations for correlation to in-line learning. This analysis often offers clear causality for yield failures but is slow (e.g., on the order of dozens per week) and can be blind to defect modes that are difficult to locate or image in TEM.

Select yield-based hit-back analysis methodologies and processes for defect-limited yield pareto include overlaying the EOL electrical failure location directly to in-line defect data. For example, select logic design methods and analysis tools may allow electrical failures to be localized into "chain" locations where the failure is likely to occur. In addition, select technologies allow in-line inspection to be guided to potential chain location failures based purely on design layout.

As illustrated in FIG. 2A, a variety of defects 200 may be detected in one or more layers 202 of the sample 104 (e.g., three (3) layers 202 as illustrated in FIG. 2A) by any component of the system 100 including, but not limited to, the inspection tool 102 or the metrology tool 106.

As illustrated in FIG. 2B, in addition to the variety of defects 200 being detected in the one or more layers 202 of the sample 104, an EOL sort yield map 204 may provide a reference of one or more locations 206 including one or more die fail chains 208 on the sample 104.

As illustrated in FIG. 2C, the one or more layers 202 including the one or more defects 200 and the EOL sort yield map 204 including the one or more locations 206 with the one or more die fail chains 208 may be represented graphically as a hit-back analysis map 210 in which all detected defects are merged into a single top-view representation of the sample 104. In the hit-back analysis map 210, the possible die fail chains 208 are overlaid with the in-line inspection results and one or more miss locations 212 and/or one or more hit locations 214 are determined. For example, a miss location 212 is one which the one or more defects 200 do not overlap and/or are not determined to cause the one or more die fail chains 208 through statistical probability. By way of another example, a hit location 214 is one in which the one or more defects 200 overlap and/or are determined to have a select statistical probability to cause the one or more die fail chains 208.

It is noted herein the one or more miss locations 212 and/or the one or more hit locations 214 may be represented by an area from the one or more die fail chains 208. For example, the area may represent a threshold (e.g., in microns (μm)) in which a defect within the range of failure has a select percentage chance of causing the die fail chain. It is noted herein the one or more miss locations 212 and/or the one or more hit locations 214 may include characteristics such as, but not limited to, film or layer thickness, film composition, wafer flatness, wafer topography, resistivity, localized stress measurements, or critical dimension measurements that may be indicative of a hotspot or spatial pattern in which additional defects may be likely to occur or for which reliability may be particularly impacted.

Figure 3:
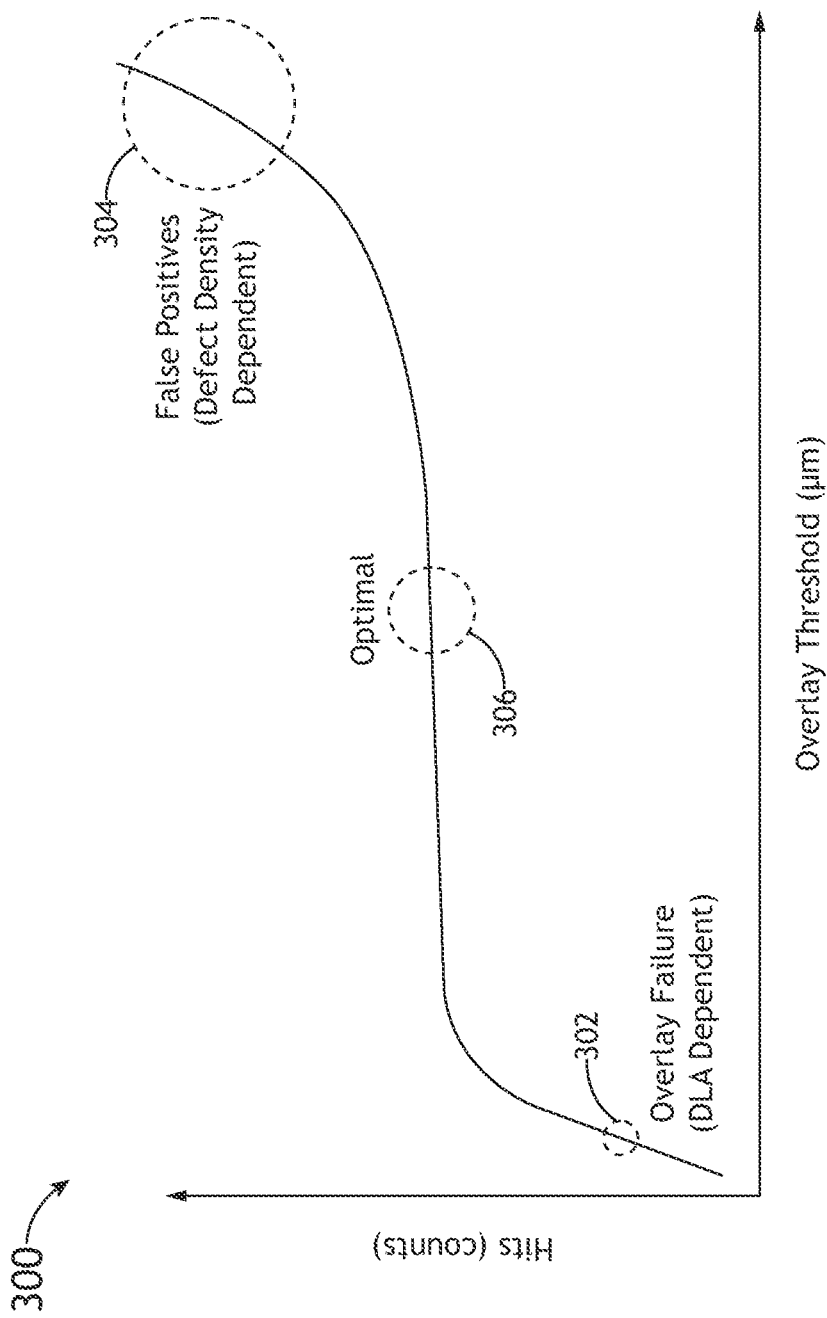
FIG. 3 is a plot illustrating total number of defect hits versus an overlay threshold, in accordance with one or more embodiments of the present disclosure.

FIG. 3 illustrates a plot 300 comparing number of hits (counts) to overlay threshold size (in μm), in accordance with one or more embodiments of the present disclosure. In one embodiment, an area 302 representing a small overlay threshold would be near the left of the plot 300 and may miss defects that cause failure, resulting in overlay failure. For example, the area 302 may be dependent on an in-line sample analysis tool defect location accuracy (DLA). In another embodiment, an area 304 representing a large overlay threshold would be near the right of the plot 300 and may catch defects that are not causing the failure, resulting in false positives. In another embodiment, an area 306 representing an optimal overlay threshold would be near the middle of the plot 300. For example, the area 306 may be large enough to account for in-line sample analysis tool DLA but small enough that the statistical probability of LRD false positive determinations is low or reduced. For instance, although not limiting, an area having at least one dimension of 5 μm may be selected.

It is noted herein stacking dies may allow dies from different locations on a sample 104 or dies across different samples 104 to be graphically compared. When correctly performed, the hit-back capture rate metric (a percentage) may quantify the number of failures which correlate to in-line defects. For example, hit-back capture rates increasing to more than 70 percent may not be uncommon for in-line monitoring processes.

FIGS. 4 and 5A-5C in general illustrate LRD methodologies or processes which are described in accordance with one or more embodiments of the present disclosure. In one embodiment, the LRD methodologies or processes include LRD baseline pareto using overlay-based hit-back analysis in conjunction with high-temperature operating life (HTOL) burn-in.

Figure 4:
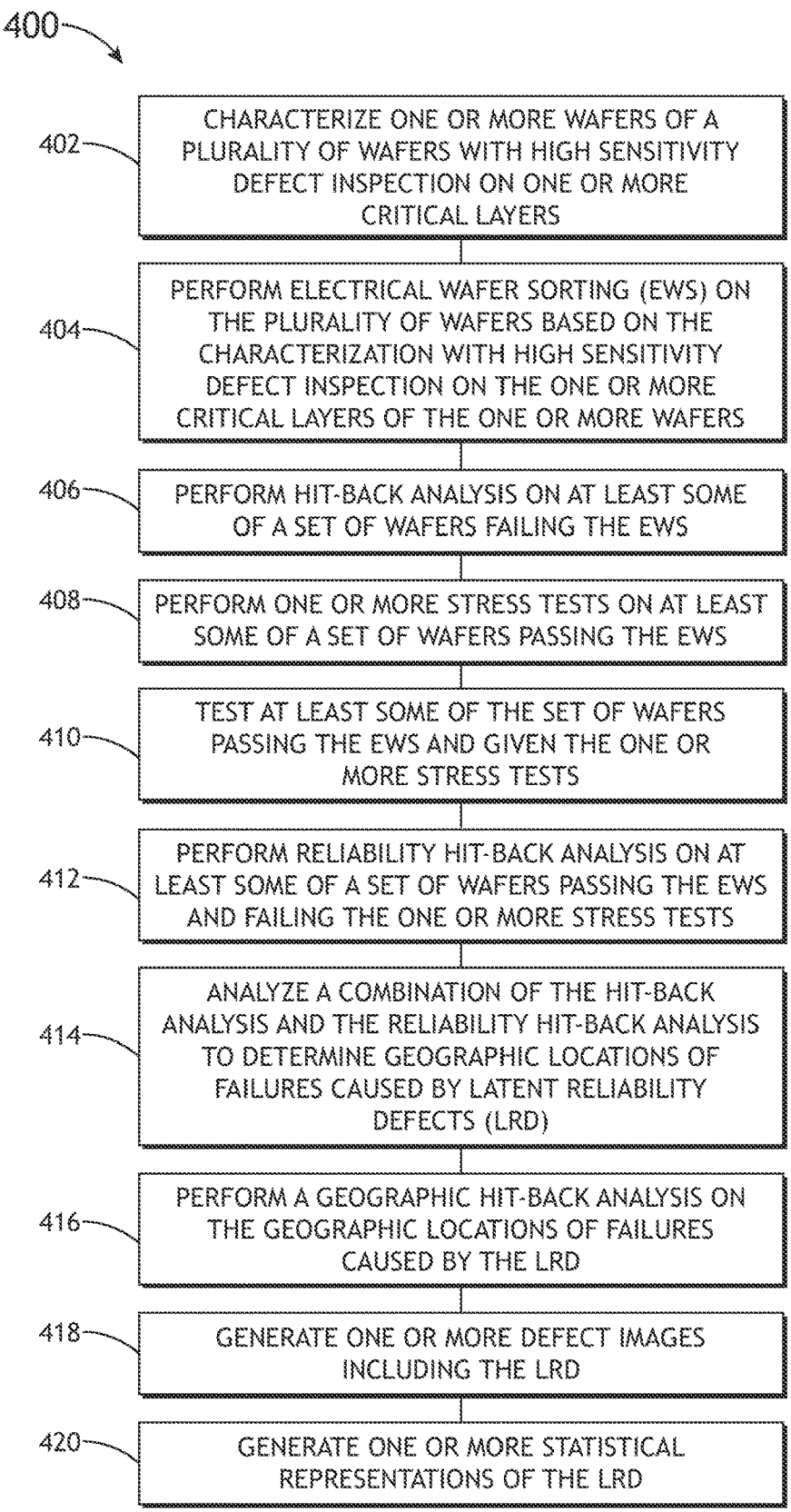
FIG. 4 is a flow diagram illustrating steps performed in a method for identifying LRD, in accordance with one or more embodiments of the present disclosure.

FIG. 4 represents a flow diagram of a method or process 400 illustrating the LRD methodologies or processes, in accordance with one or more embodiments of the present disclosure. It is noted herein that the steps of method or process 400 may be implemented all or in part by the system 500 illustrated in FIGS. 5A-5C. It is further recognized, however, that the method or process 400 is not limited to the system 500 illustrated in FIGS. 5A-5C in that additional or alternative system-level embodiments may carry out all or part of the steps of method or process 400.

It is noted herein any step of the method or process 400 may include any selected dies within any selected number of samples 104. For example, a population may include, but is not limited to, selected dies from a single sample 104, multiple samples 104 within a lot (e.g., a production lot), or selected samples 104 across multiple lots.

In a step 402, one or more wafers of a plurality of wafers are characterized with high sensitivity defect inspection on one or more critical layers. In one embodiment, box 502 represents at least some of the system 100 as illustrated in FIGS. 1A and 1B. In this regard, the steps of method or process 400 may be implemented all or in part by the system 100 illustrated in FIGS. 1A and 1B. In box 502, a plurality of wafers is fabricated following a number (e.g., tens, hundreds, thousands) of steps performed by a number of fabrication processes. For example, fabrication may be performed by the at least one semiconductor fabrication tool 118.

Following fabrication, one or more wafers of the plurality of wafers receive high sensitivity inspection (e.g., broadband plasma inspection, or the like) on all critical layers (e.g., between 20-50 layers) with complete or nearly complete SEM review.

For example, the one or more wafers may include between 20-50 critical layers, depending on the design rule of the one or more wafers. Select patterned wafer inspection systems incorporate technologies leveraging design data to define small (e.g., on the order of microns) inspection areas focused solely on critical patterns. Using these design-based technologies to inspect patterns related to potential chain failures produces inspection results consisting of defects that are strongly correlated to end-of-line yield. This more direct technique allows for faster turn-around on analysis, enables higher sampling (hundreds of defects/wafer) and can provide successful causality on defect modes that are difficult to find physically at EOL.

By way of another example, the SEM review may be 100 percent. Critical defect types may be determined using inspection tool 102 attribute information in conjunction with on-tool deterministic binning or machine learning analysis systems to recognize potential LRD. This may occur directly on the inspection tool 102, on the metrology tool 106, or in an offline analysis system.

In another embodiment, additional layers following the one or more critical layers are selected to observe changes in morphology for critical defects as the wafer continues processing (e.g., continues through one or more fabrication processes). For example, a subsequent clean may remove the defect, a deposited film may embed the defect, an etch back step may decorate the defect, or the like.

In a step 404, electrical wafer sorting (EWS) is performed on the plurality of wafers based on the characterization with high sensitivity defect inspection on the one or more critical layers of the one or more wafers. In box 504, the plurality of wafers is subjected to wafer level tests, with dies still being physically on each wafer, and packaged. The plurality of wafers is sorted into EWS-passing and EWS-failing sets of the plurality of wafers.

In a step 406, hit-back analysis is performed on at least some of a set of wafers failing the EWS. In box 506, hit-back analysis is performed on some or all of the set of wafers failing the EWS. The wafer level tests for the failed set of the plurality of wafers is correlated with the one or more critical layers using overlay. It is noted herein the hit-back analysis process is illustrated and described in FIGS. 2A-2C and 3.

In a step 408, one or more stress tests are performed on at least some of a set of wafers passing the EWS. In box 508, the one or more stress tests are performed on some or all of the set of wafers passing the EWS. For example, some or all of the set of wafers passing the EWS includes all die or a targeted sample of die with reliability-relevant defects. For instance, which of the set of wafers pass the EWS may be determined with on-tool deterministic binning or machine learning analysis systems. The EWS-passing set of the plurality of wafers are sorted into stress test-passing and stress test-failing sets of the plurality of wafers.

It is noted herein the removal of the EWS-failing set of the plurality of wafers in step 404/box 504 prior to the application of the one or more stress tests in step 408/box 508 results in the subtracting of information not related to LRD before one or more stress tests are applied. In addition, it is noted herein the one or more stress tests may need to be controlled to prevent good wafers from being incorrectly broken resulting in false negatives and need to be controlled to prevent bad wafers from passing resulting in false positives.

The one or more stress tests include high acceleration-factor burn-in, such as intensive HTOL burn-in tests. For example, the HTOL burn-in test may stress a device at one or more of an elevated temperature, a high voltage, and/or a dynamic operation for a predefined period of time. In another embodiment, the one or more stress tests may include burn-to-failure tests. For instance, stressing wafers to activate LRD may include one or more of heating the wafer in an oven and testing at an elevated temperature, cooling the wafer and testing at a low temperature (e.g., −20 degrees Celsius (° C.)), testing at an improper voltage (e.g., 5 Volts (V) instead of 3 V), or the like.

In a step 410, at least some of the set of wafers passing the EWS and given the one or more stress tests are given a final test. In box 510, the final test may allow for the removal of the stress test-passing set of the plurality of wafers after one or more stress tests. It is noted herein the removal of the stress test-passing set of the plurality of wafers after the one or more stress tests, in combination with the removal of the EWS-failing set of the plurality of wafers in step 404/box 504 prior to the application of the one or more stress tests in step 408/box 508, allows for the determination of wafers with LRD.

In a step 412, a reliability hit-back analysis is performed on a set of wafers passing the EWS and failing the one or more stress tests. In box 512, hit-back analysis is performed on some or all of the set of wafers failing the stress test. The wafer level tests for the failed set of the plurality of wafers are correlated with the one or more critical layers using overlay. It is noted herein the hit-back analysis process is illustrated and described in FIGS. 2A-2C and 3. The reliability hit-back analysis provides a reference of the LRD causing the reliability failure, before the LRD activates.

In a step 414, the hit-back analysis and the reliability hit-back analysis are combined and analyzed to determine a geographic location of the failure caused by LRD. In box 514, the analysis includes a bitmap analysis and/or a block chain failure analysis. For example, the bitmap analysis and/or the block chain failure analysis may determine an (x, y) location for a particular LRD, or a localization of failure for the particular LRD. It is noted herein the reliability hit-back analysis may alone be analyzed to determine a geographic location of the failure caused by LRD.

In a step 416, a geographic hit-back analysis is performed on the geographic locations of failures caused by the LRD. In box 516, the geographic hit-back analysis from electrical die fail chains to in-line defect locations utilize geometry-based overlay algorithms to combine the point-based in-line defect location with area-based reporting of EOL chains. For example, the electrical die fail chain locations may utilize layer information as well as (x, y) mapping. The geographic hit-back analysis overlays information from the bitmap analysis and/or the block chain failure analysis in box 514 and information from a yield management system illustrated in box 518. For example, the yield management system in box 518 may receive a results file from the system 100 and/or components of the system 100 (e.g., the at least one semiconductor fabrication tool 118, or the like) in box 502. It is noted herein the wafers utilized for the geographic hit-back analysis should be inspected at all key process steps of the method or process 400 to avoid holes in potential causality to the EOL failure. For example, all defects found should be utilized for analysis, not just defects that are classified by subsequent review steps.

Figure 5A:
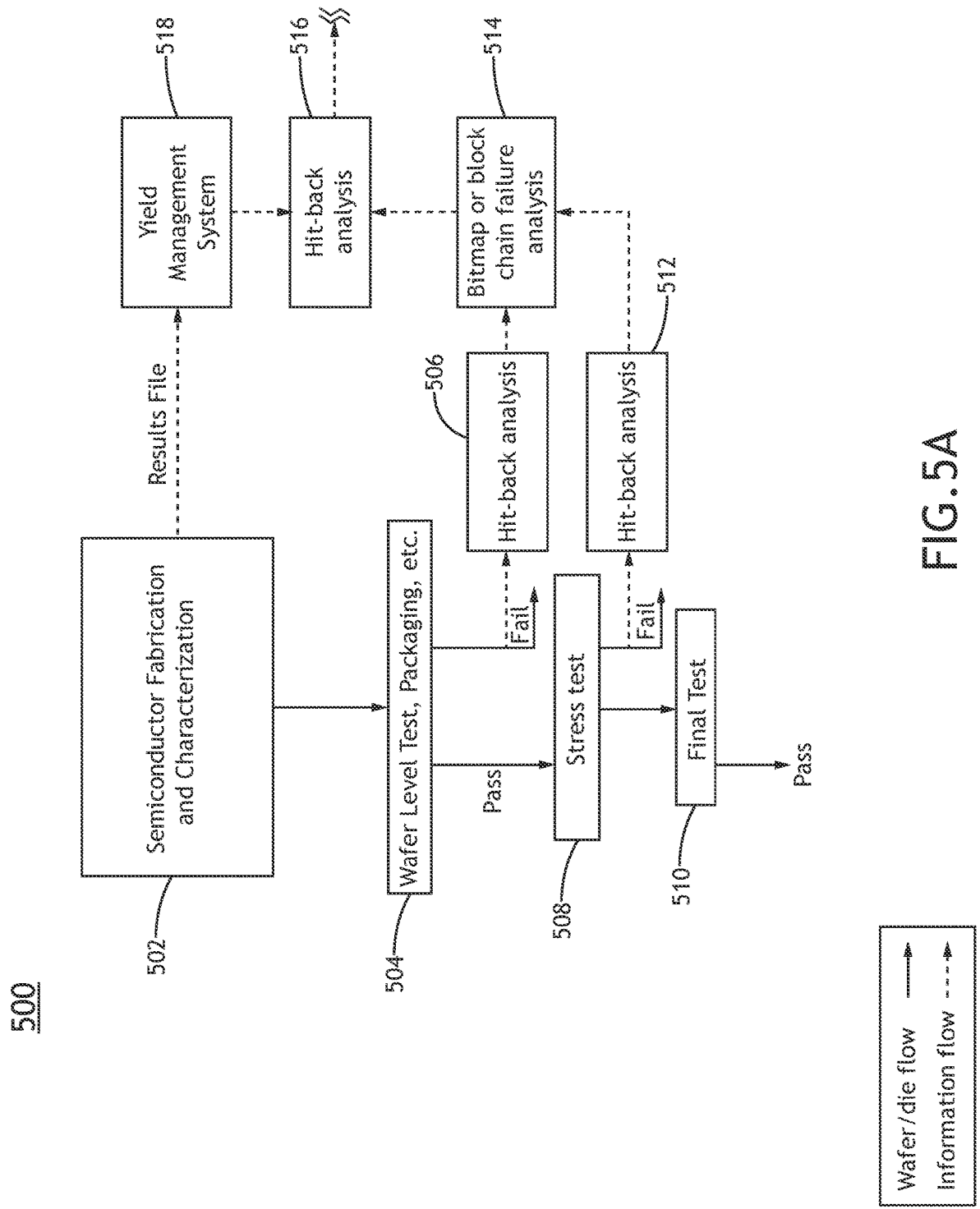
FIG. 5A is a conceptual illustration of a system 500 for identifying LRD, in accordance with one or more embodiments of the present disclosure.
Figure 5B:
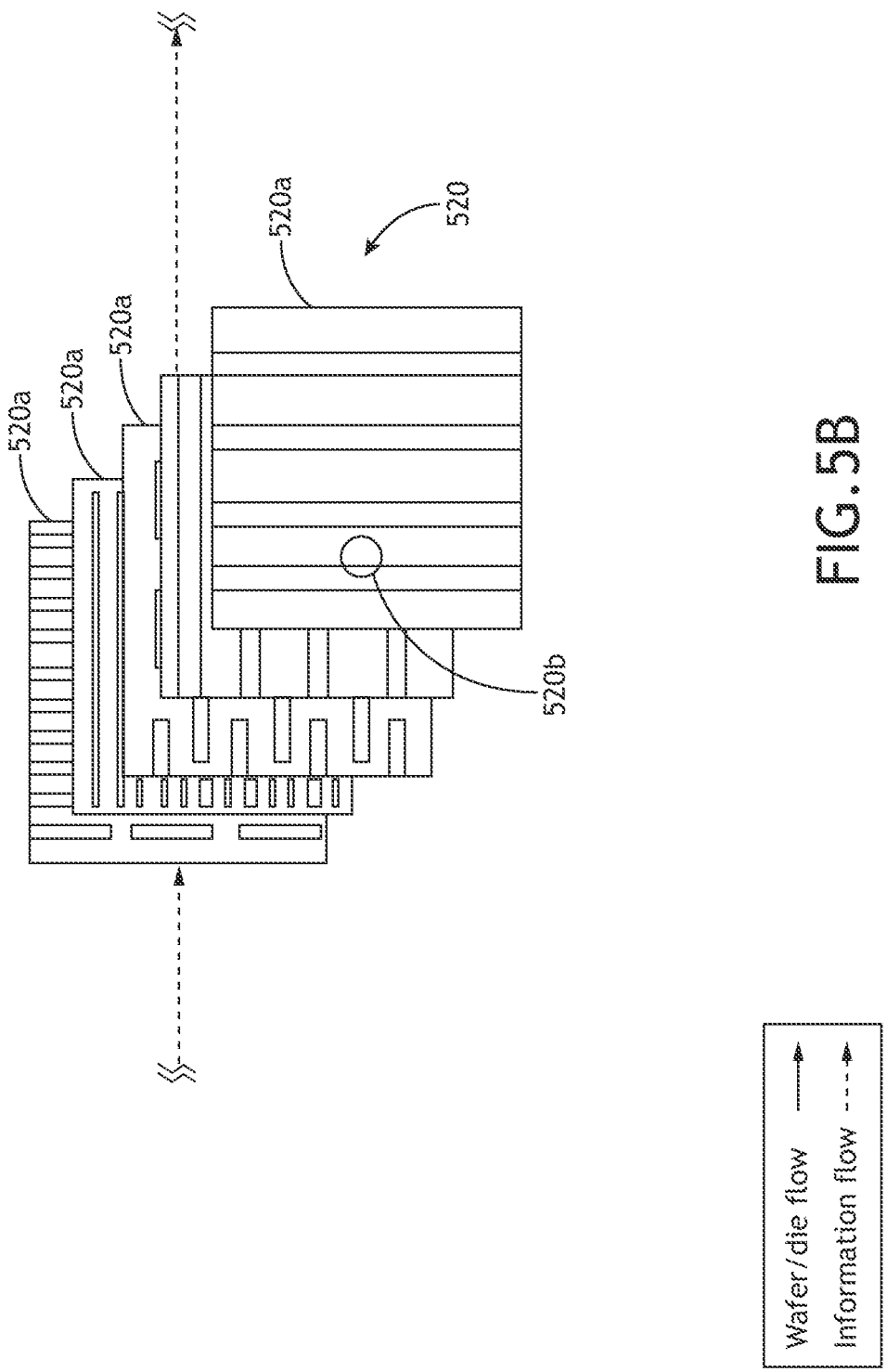
FIG. 5B are illustrations of observed LRD on a wafer, in accordance with one or more embodiments of the present disclosure.
Figure 5C:
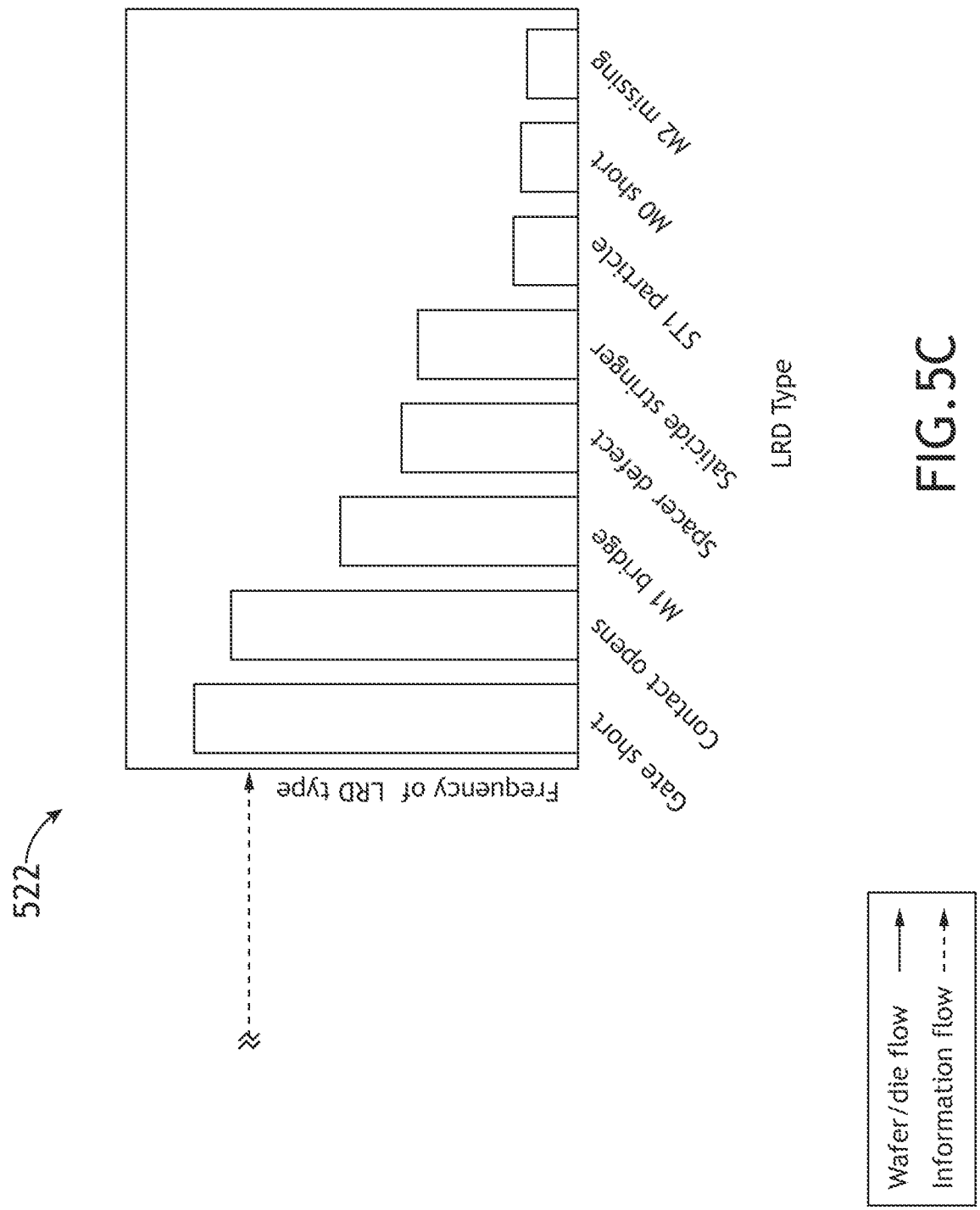
FIG. 5C is a bar graph illustrating a frequency of LRD type versus type of LRD observed on a wafer, in accordance with one or more embodiments of the present disclosure.

It is noted herein an additional system may be included within the system for identifying latent reliability defects as illustrated in FIGS. 5A-5C which records and stores raw defect information for use during the overlay.

In a step 418, one or more defect images including the LRD are generated. Referring now to FIG. 5B, a gallery or set 520 of defect images 520a are generated following the geographic hit-back analysis of box 516. For example, each defect image 520a includes a representation of an LRD 520b causing a reliability failure, before the LRD activates, providing actionable information on the root cause of the failure. It is noted herein illustrating the LRD 520b within the defect image 520a before the LRD 520b activates is important, as it is likely the activation of the LRD 520b would result in an inability to determine what caused the failure (e.g., due to partial or complete destruction of the LRD 520b during activation, or the like). For example, copper cladding within a process margin may be determined to cause the LRD 520b, allowing an engineering team to review and address before the copper cladding is destroyed when it is activated (e.g., thus providing a value to a manufacturing process, system, or team).

In a step 420, one or more statistical representations of the LRD 520 b are generated. Referring now to FIG. 5C, a graph 522 comparing number per LRD type versus number of LRD types is generated following the geographic hit-back analysis of box 516. In one example, the graph 522 is usable as an illustration or teaching tool for continuous improvement in terms of reducing number of LRD types and number per LRD type, which may drive continuous improvement in baseline LRD pareto reduction and thus provide a value to a business employing the systems and methods for identifying LRD in semiconductor devices.

It is noted herein the set 520 of defect images 520a and/or the graph 522 may be displayed on the user interface 116, as illustrated in FIGS. 1A and 1B and described throughout the present disclosure. In addition, it is noted herein the set 520 of defect images 520a and/or the graph 522 may be displayed on a display device separate from the user interface 116.

It is noted herein the systems and methods for identifying latent reliability defects may address extrinsic (defect) reliability failures, but may not be intended to address intrinsic failures (e.g., time-dependent dielectric breakdown, hot carrier injections, or the like).

Based on the description provided throughout the present disclosure, one non-limiting combination of embodiments of the systems and methods for identifying latent reliability defects in semiconductor devices includes in-line defect inspection tools (e.g., broadband plasma, or the like) coupled with in-line technologies that leverages design data to define small (e.g., on the order of microns) inspection areas focused on critical patterns, yield management analysis systems and processes, EWS test data, final test data, and stress tests (e.g., HTOL burn-in, or the like). This combination of embodiments of the systems and methods for identifying LRD in semiconductor devices provides the semiconductor fabrication processes with an accurate picture (e.g., literal and/or figurative picture) of an LRD baseline which is sufficiently detailed to drive a continuous reduction in reliability defects. For example, the systems and methods for identifying latent reliability defects in semiconductor devices may provide in-line SEM images of the LRD prior to activation and without the collateral damage caused by PFA delayering. By way of another example, the systems and methods for identifying latent reliability defects in semiconductor devices may provide an LRD pareto based on the actual defect mechanisms instead of the resulting electrical properties. By way of another example, the systems and methods for identifying latent reliability defects in semiconductor devices may reduce reliability failures from the PPM to the PPB level.

Figure 6:
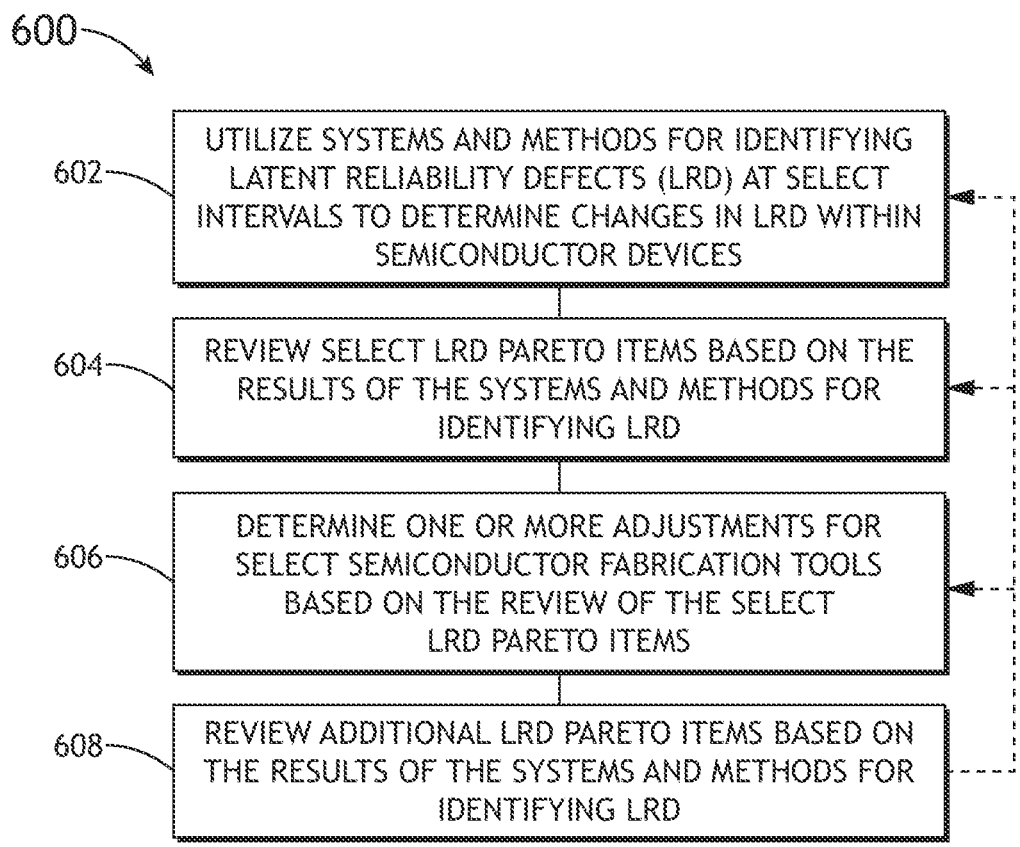
FIG. 6 is a flow diagram illustrating steps performed in a method for utilizing systems and methods for identifying LRD, in accordance with one or more embodiments of the present disclosure.

FIG. 6 illustrates a method or process 600 to utilize the systems and methods for identifying LRD, in accordance with one or more embodiments of the present disclosure. It is noted herein that the steps of method or process 600 may implement all or a part of the method or process 400 illustrated in FIG. 4/the system 500 illustrated in FIGS. 5A-5C. It is further recognized, however, that the method or process 600 is not limited to the method or process 400 illustrated in FIG. 4/the system 500 illustrated in FIGS. 5A-5C in that additional or alternative system-level embodiments may carry out all or part of the steps of method or process 600.

In a step 602, the systems and methods for identifying LRD may be utilized at selected intervals to determine changes in LRD within semiconductor devices. In one embodiment, some or all of the steps of the method or process 400 may be used in conjunction with the system 500. For example, a semiconductor device manufacturer may utilize the systems and methods for identifying LRD in semiconductor devices at regularly-spaced or irregularly-spaced intervals to provide an accurate view of the constantly-changing LRD pareto over time. It is noted herein the intervals may be defined at least in part by the output of the one or more semiconductor fabrication processes, by the time between runs of the one or more semiconductor fabrication processes, or the like.

In a step 604, select LRD pareto items are reviewed based on the results of the systems and methods for identifying LRD. For example, the semiconductor device manufacturer may assign engineering teams to explore the top 3 pareto items (e.g., selected based on frequency of occurrence, either unweighted or weighted), who may utilize the systems and methods for identifying latent reliability defects in semiconductor devices to better understand the process window, process defectivity, tool defectivity, and other influences on LRD formation.

In a step 606, one or more adjustments are determined for select semiconductor fabrication tools based on the review of the select LRD pareto items. For example, the engineering teams may determine adjustments including, but not limited to, process tool recipe changes, process tool upgrade changes, new process tool changes, new raw material changes, or the like. For instance, the changes may be to the design specification (e.g., film thickness; size, shape, orientation, or position of a fabricated feature; or the like) of the wafers or the dies on the wafers. The engineering teams may generate control signals which may be provided (e.g., transmitted through wired or wireless connections, transmitted via a memory device, or the like) via a feed forward loop or feedback loop to the select semiconductor fabrication tools, received by the select semiconductor fabrication tools, and implemented by the select semiconductor fabrication tools. It is noted herein, however, the engineering teams may manually make the adjustments.

In a step 608, additional LRD pareto items are reviewed based on the results of the systems and methods for identifying LRD. For example, as the LRD sources related to the top 3 pareto items are diminished post-adjustment of the semiconductor fabrication tool, the engineering teams may begin working on the new top 3 pareto items (e.g., items 4-6 of the results of the systems and methods for identifying LRD, in one example). In this manner, the semiconductor device manufacturer experiences an overall improvement in LRD levels over time. The semiconductor device manufacturer may understand new and re-emerging LRD mechanisms, especially those tied to a particular technology but not others.

It is noted herein the semiconductor device manufacturer may validate the effectiveness of the changes through the LRD pareto through designed experiments on dedicated wafers following the some or all of the steps in the method or process 600.

In this regard, the semiconductor device manufacturer may utilize the results from the systems and methods for identifying latent reliability defects in semiconductor devices as part of the fabrication audit process and/or fabrication certification to document a commitment to continuous improvement by systematically targeting sources of latent reliability defect problems with appropriate defect reduction activities, and monitor for excursions in the semiconductor fabrication processes to determine whether the semiconductor fabrication processes are and/or may be the source of the latent reliability defects.

It is noted herein the methods or processes 400 and 600 are not limited to the steps and/or sub-steps provided. The methods or processes 400 and 600 may include more or fewer steps and/or sub-steps. The methods or processes 400 and 600 may perform the steps and/or sub-steps simultaneously. The methods or processes 400 and 600 may perform the steps and/or sub-steps sequentially, including in the order provided or an order other than provided. Therefore, the above description should not be interpreted as a limitation on the scope of the present disclosure but merely an illustration.

Additional non-limiting examples of how and/or when to utilize the systems and methods for identifying latent reliability defects in semiconductor devices include U.S. patent application Ser. No. 17/101,856, filed Nov. 23, 2020, and U.S. Pat. No. 10,761,128, issued Sep. 1, 2020, both of which are incorporated herein in the entirety. For instance, the systems and methods for identifying latent reliability defects in semiconductor devices may provide an understanding about how and/or when to apply part average testing (PAT), in-line part average testing (I-PAT), and geographic part average testing (G-PAT) for screening and monitoring of wafers as described in the above-incorporated references.

In this regard, advantages of the present disclosure include performing the hit-back to final test data following an intensive HTOL burn-in test or other stress test, which is designed to activate LRDs to show up as failures. Advantages of the present disclosure also include analysis software which performs the overlay of test to scan chain data and removes yield-limiting failures from the dataset. Advantages of the present disclosure also include an ability to see defect progression by capturing in-line SEM images at multiple layers.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system comprising:
   a controller communicatively coupled to one or more in-line sample analysis tools and one or more stress test tools, the controller including one or more processors configured to execute program instructions causing the one or more processors to:
   characterize at least some of a plurality of wafers;
   perform electrical wafer sorting (EWS) on the plurality of wafers based on the characterization to determine an EWS-passing set of the plurality of wafers and an EWS-failing set of the plurality of wafers;
   perform one or more stress tests with the one or more stress test tools on at least some of the EWS-passing set of the plurality of wafers to determine a passing set of the plurality of wafers and a failing set of the plurality of wafers, the plurality of wafers received from the one or more in-line sample analysis tools, each wafer of the plurality of wafers including a plurality of layers, each layer of the plurality of layers including a plurality of dies;

perform a reliability hit-back analysis on at least some of the failing set of the plurality of wafers;

analyze the reliability hit-back analysis to determine one or more geographic locations of one or more die fail chains caused by one or more latent reliability defects (LRD); and perform a geographic hit-back analysis on the one or more geographic locations of the one or more die fail chains caused by the LRD.

2. The system of claim 1, the controller including the one or more processors configured to execute the program instructions causing the one or more processors to:

perform a yield hit-back analysis on at least some of the EWS-failing set of the plurality of wafers; and analyze a combination of the yield hit-back analysis and the reliability hit-back analysis to determine the one or more geographic locations of the one or more die fail chains caused by the LRD.

3. The system of claim 2, wherein at least one of the reliability hit-back analysis, the geographic hit-back analysis, or the yield hit-back analysis generates a hit-back analysis map by overlaying an end-of-line (EOL) sort yield map on a merged set of images representative of a plurality of layers of a wafer of the plurality of wafers, wherein the hit-back analysis map includes an overlay threshold, wherein the overlay threshold is selected to account for an in-line sample analysis tool and reduce a statistical probability of LRD false positive determinations.

4. The system of claim 3, wherein the EOL sort yield map includes the one or more die fail chains, wherein the hit-back analysis map includes one or more defects, wherein a wafer of the plurality of wafers fails the EWS when at least some defects of the one or more defects are determined to have a select statistical probability to cause at least some die fail chains of the one or more die fail chains.

5. The system of claim 2, wherein the combination of the yield hit-back analysis and the reliability hit-back analysis is analyzed with at least one of a bitmap analysis or a block chain failure analysis.

6. The system of claim 1, the controller including the one or more processors configured to execute the program instructions causing the one or more processors to at least one of:

generate one or more defect images including the LRD; or
generate one or more statistical representations including the LRD.

7. The system of claim 6, further comprising:

one or more user interfaces communicatively coupled to the controller, the one or more user interfaces configured to display at least one of the one or more defect images including the LRD or the one or more statistical representations including the LRD.

8. The system of claim 6, the controller including the one or more processors configured to execute the program instructions causing the one or more processors to:

determine one or more adjustments for one or more semiconductor fabrication tools, the one or more adjustments being determined based on a review of at least one of the one or more defect images including the LRD or the one or more statistical representations including the LRD.

9. The system of claim 8, the controller including the one or more processors configured to execute the program instructions causing the one or more processors to:

generate one or more control signals based on the determined one or more adjustments.

10. The system of claim 9, the controller including the one or more processors configured to execute the program instructions causing the one or more processors to:

provide the one or more control signals to the one or more semiconductor fabrication tools via at least one of a feed forward or a feedback loop.

11. The system of claim 1, wherein the one or more in-line sample analysis tools comprise:

at least one of an inspection tool or a metrology tool.

12. The system of claim 1, wherein the one or more stress test tools include at least one of a pre burn-in electrical test tool or a post burn-in electrical test tool.

13. The system of claim 12, wherein the one or more stress test tools are configured to at least one of heat at least some of the plurality of wafers, cool at least some of the plurality of wafers, or operate at least some of the plurality of wafers at an incorrect voltage.

14. A method comprising:

characterizing at least some of a plurality of wafers received from one or more in-line sample analysis tools;

performing electrical wafer sorting (EWS) on the plurality of wafers based on the characterization to determine an EWS-passing set of the plurality of wafers and an EWS-failing set of the plurality of wafers;

performing one or more stress tests with one or more stress test tools on at least some of the EWS-passing set of the plurality of wafers to determine a passing set of the plurality of wafers and a failing set of the plurality of wafers, the plurality of wafers received from one or more in-line sample analysis tools, each wafer of the plurality of wafers including a plurality of layers, each layer of the plurality of layers including a plurality of dies;

performing a reliability hit-back analysis on at least some of the failing set of the plurality of wafers;

analyzing the reliability hit-back analysis to determine one or more geographic locations of one or more die fail chains caused by one or more latent reliability defects (LRD); and performing a geographic hit-back analysis on the one or more geographic locations of the one or more die fail chains caused by the LRD.

15. The method of claim 14, further comprising:

performing a yield hit-back analysis on at least some of the EWS-failing set of the plurality of wafers; and analyzing a combination of the yield hit-back analysis and the reliability hit-back analysis to determine the one or more geographic locations of the one or more die fail chains caused by the LRD.

16. The method of claim 15, wherein at least one of the reliability hit-back analysis, the geographic hit-back analysis, or the yield hit-back analysis generates a hit-back analysis map by overlaying an end-of-line (EOL) sort yield map on a merged set of images representative of a plurality of layers of a wafer of the plurality of wafers, wherein the hit-back analysis map includes an overlay threshold, wherein the overlay threshold is selected to account for an in-line sample analysis tool and reduce a statistical probability of LRD false positive determinations.

17. The method of claim 16, wherein the EOL sort yield map includes the one or more die fail chains, wherein the hit-back analysis map includes one or more defects, wherein a wafer of the plurality of wafers fails the EWS when at least some defects of the one or more defects are determined to have a select statistical probability to cause at least some die fail chains of the one or more die fail chains.

18. The method of claim 15, wherein the combination of the yield hit-back analysis and the reliability hit-back analysis is analyzed with at least one of a bitmap analysis or a block chain failure analysis.

19. The method of claim 14, further comprising at least one of:
generate one or more defect images including the LRD; or
generate one or more statistical representations including the LRD.

20. The method of claim 19, at least one of the one or more defect images including the LRD or the one or more statistical representations including the LRD being displayed on one or more user interfaces.

21. The method of claim 19, further comprising:
determining one or more adjustments for one or more semiconductor fabrication tools, the one or more adjustments being determined based on a review of at least one of the one or more defect images including the LRD or the one or more statistical representations including the LRD.

22. The method of claim 21, further comprising:
generating one or more control signals based on the determined one or more adjustments.

23. The method of claim 22, further comprising:
providing the one or more control signals to the one or more semiconductor fabrication tools via at least one of a feed forward or a feedback loop.

24. The method of claim 14, wherein the one or more in-line sample analysis tools comprise:
at least one of an inspection tool or a metrology tool.

25. The method of claim 14, wherein the one or more stress test tools include at least one of a pre burn-in electrical test tool or a post burn-in electrical test tool.

26. The method of claim 25, wherein the one or more stress test tools are configured to at least one of heat at least some of the plurality of wafers, cool at least some of the plurality of wafers, or operate at least some of the plurality of wafers at an incorrect voltage.

27. A system comprising:
one or more in-line sample analysis tools;
one or more stress test tools; and
a controller communicatively coupled to the one or more in-line sample analysis tools and the one or more stress test tools, the controller including one or more processors configured to execute program instructions causing the one or more processors to:
characterize at least some of a plurality of wafers;
perform electrical wafer sorting (EWS) on the plurality of wafers based on the characterization to determine an EWS-passing set of the plurality of wafers and an EWS-failing set of the plurality of wafers;
perform one or more stress tests with the one or more stress test tools on at least some of the EWS-passing set of the plurality of wafers to determine a passing set of the plurality of wafers and a failing set of the plurality of wafers, the plurality of wafers received from the one or more in-line sample analysis tools, each wafer of the plurality of wafers including a plurality of layers, each layer of the plurality of layers including a plurality of dies;
perform a reliability hit-back analysis on at least some of the failing set of the plurality of wafers;
analyze the reliability hit-back analysis to determine one or more geographic locations of one or more die fail chains caused by one or more latent reliability defects (LRD); and
perform a geographic hit-back analysis on the one or more geographic locations of the one or more die fail chains caused by the LRD.

* * * * *